United States Patent [19]

McIver et al.

[11] Patent Number: 4,507,845

[45] Date of Patent: Apr. 2, 1985

[54] METHOD OF MAKING FIELD EFFECT TRANSISTORS WITH OPPOSED SOURCE AND GATE REGIONS

[75] Inventors: George W. McIver, Redondo Beach; Kenichi Nakano, North Hollywood; John J. Berenz, Lawndale, all of Calif.

[73] Assignee: TRW Inc., Redondo Beach, Calif.

[21] Appl. No.: 531,548

[22] Filed: Sep. 12, 1983

[51] Int. Cl.³ .................... H01L 29/80; H01L 21/283
[52] U.S. Cl. .................... 29/571; 29/576 B; 148/1.5; 148/175; 148/187; 357/22; 357/91
[58] Field of Search ............. 29/571, 576 B; 148/1.5, 148/175, 187; 357/22, 91

[56] References Cited

U.S. PATENT DOCUMENTS

| | | | |
|---|---|---|---|
| 3,663,873 | 5/1972 | Yagi | 357/22 |
| 4,015,278 | 3/1977 | Fukuta | 357/55 |
| 4,129,879 | 12/1978 | Tantraporn | 357/22 |
| 4,236,166 | 11/1980 | Cho et al. | 357/22 |
| 4,249,190 | 2/1981 | Cho | 357/22 |
| 4,297,718 | 10/1981 | Nishizawa et al. | 357/22 |
| 4,325,073 | 4/1982 | Hughes et al. | 29/571 |
| 4,338,616 | 7/1982 | Bol | 357/22 |
| 4,343,015 | 8/1982 | Bayga et al. | 357/55 |
| 4,416,053 | 11/1983 | Figueroa et al. | 29/571 |
| 4,467,518 | 8/1984 | Bansal et al. | 29/571 |

Primary Examiner—Upendra Roy
Attorney, Agent, or Firm—Robert M. Wallace; Noel F. Heal

[57] ABSTRACT

A field-effect transistor in which the gate and source are positioned on opposite faces of a substrate, and a method for its fabrication. In the method, a stop-etch buffer layer and an active semiconductor layer are successively formed by molecular beam epitaxy on a first face of a substrate of semi-insulating material, such as gallium arsenide. A source via hole is etched from the opposite face of the substrate, using a first etchant that does not react with the buffer layer, and extended through the buffer layer with a second etchant that does not react with the active layer. After metalization of the source via hole, electron beam lithography techniques are used to determine its location as viewed from the first face of the substrate. Then a mesa area is formed from the active layer, and drain and gate areas are defined in precise relation to the source via hole, and are metalized.

9 Claims, 9 Drawing Figures

METHOD OF MAKING FIELD EFFECT TRANSISTORS WITH OPPOSED SOURCE AND GATE REGIONS

This invention was made with Government support under contract number N00123-81-C-1225 awarded by the Department of the Navy, Office of Naval Research. The Government has certain rights in this invention.

CROSS-REFERENCE TO RELATED APPLICATION

This application is related to a prior application Ser. No. 347,226, filed Feb. 9, 1982, by John J. Berenz et al., entitled "Opposed Gate-Source Transistor."

BACKGROUND OF THE INVENTION

This invention relates generally to field-effect transistors (FET's), and more particularly, to field-effect transistors capable of operation at extremely high frequencies, as high as 300 gigahertz (GHz) or higher. Since the wavelength at these frequencies is one millimeter (mm) or less, such devices are sometimes referred to as millimeter-wave devices. High frequency transistors of this type may be usefully incorporated into monolithic circuits, either digital or analog, operating at millimeter or shorter wavelengths, or may be employed in discrete form as amplifiers or oscillators, as well as in mixers, frequency multipliers, and so forth.

By way of background, a field-effect transistor (FET) is a three-terminal amplifying or switching semiconductor device in which charge carriers flow along an active channel region between a source terminal and a drain terminal. When a bias voltage is applied to a gate terminal adjacent to the channel, a carrier depletion region is formed in the channel and the current flow is correspondingly inhibited. In a conventional FET, the source and drain terminals make contact with source and drain semiconductor regions of the same conductivity type, and the active channel takes the form of a planar layer extending between the source and drain regions. The gate terminal makes contact with the channel at a point between the source and the drain, and usually on the same face of the device as the source and drain terminals.

As indicated in the cross-referenced application, the performance of a conventional FET at high frequencies is limited principally by the transconductance of the device, as well as by the source resistance, the source inductance, and by other circuit "parasitics," or internal impedances associated with the transistor. As also discussed in the cross-referenced application, various attempts have been made to reduce parasitic impedances. Patents of interest in this regard are Decker (U.S. Pat. No. 4,141,021), Cho (U.S. Pat. No. 4,249,190), Tantraporn (U.S. Pat. No. 4,129,879), Cho et al. (U.S. Pat. No. 4,236,166), and Nelson (U.S. Pat. No. 2,985,805).

All of these prior art devices are still limited in their performance at high frequencies by a relatively low incremental transconductance per unit width, and by the presence of significant parasitic impedances. In the cross-referenced application a novel FET structure was disclosed and claimed, in which the source and gate are located on opposite faces of the semiconductor channel region, the source having an effective length substantially less than that of the gate, and being located symmetrically with respect to the gate. Two separate drains are located at opposite ends of the channel region, and current flows in two parallel paths from the source to the two drains. In this parallel configuration, the incremental transconductance per unit width is approximately twice that of a single conventional FET of similar design, thus improving the high-frequency performance of the device. The opposed gate-source configuration permits the source to be connected to a metalized ground plane. This arrangement practically eliminates source resistance and source inductance, which also improves high-frequency performance.

Although the FET structure and related method descibed in the cross-referenced application is generally satisfactory in most respects, if the dimensions of the device are reduced to achieve higher frequencies it becomes increasingly difficult to align the source and gate with the requisite accuracy. In the prior application, the source is formed as a buried region, from the same face of the substrate as the one on which the gate and drains are formed. The channel region is formed over the source region, and contact with the source is made by forming an opening in the opposite face of the substrate. Regardless of the specific structure of the device, if the source and gate are disposed on opposite faces of the substrate, there will be a significant difficulty, which will be aggravated at higher frequencies, in aligning the source and gate. The present invention is directed to a technique for alleviating this difficulty.

SUMMARY OF THE INVENTION

The present invention resides in novel fabrication method, and a semiconductor structure resulting from the method, for producing an opposed gate-source FET in which the source and gate are accurately and conveniently aligned, allowing operation at higher frequencies. In accordance with the method, the FET channel region is formed over a substrate, and the source is defined by etching a via hole from the opposite face of the substrate. A stop-etch layer between the substrate and the channel region prevents any of the channel region from being etched away during these steps. After metalization of the via hole, an electron beam lithography (EBL) technique is employed to locate the via hole and to define a mesa area symmetrically with respect to the source. The active layer surrounding the mesa area is selectively etched away, to leave only the defined mesa area, which functions as the FET channel. EBL is also used to define drain metalization areas at the edges of the mesa, and a gate area at its center.

More specifically, the device of the invention is formed on a semi-insulating substrate, which, in the preferred embodiment, is of gallium arsenide (GaAs). First, a buffer layer of semi-insulating gallium aluminum arsenide (GaAlAs) is formed on the substrate by a molecular beam epitaxy (MBE) technique; then an active layer of n-type gallium arsenide is formed over the buffer layer, in a practically continuous sequence using the same MBE technique. Next, a layer of silicon nitride ($Si_3N_4$) is formed on the underside of the substrate, and an opening is formed in this layer to define the location of a via hole to be formed in the substrate. The via hole is then etched into the substrate through the opening, and is extended through the substrate material to the buffer layer. A different etchant is then used to extend the via hole through the buffer layer, but without etching away any of the active layer.

Ohmic metal is evaporated onto the underside of the substrate, including the inner surface of the via hole, which is V-shaped. The entire structure is then bonded to another substrate, for better support, and an electron beam lithography (EBL) machine is employed to locate the position of the via hole from above, using the back-scattered electron image of the device, and to form alignment marks that define the via hole position. The mesa area to be centered over the via hole is defined by EBL and the surrounding area of the active layer is etched away, leaving only the mesa area as the channel region of the device. Drain areas are defined by EBL at the edges of the mesa, and ohmic metal is evaporated onto the areas and alloyed. Finally, the gate area is defined by EBL, and gate metal is evaporated onto the gate area, which is located precisely opposite the source area defined by the via hole.

The principal advantage of the process of the invention is that the device can be conveniently fabricated using submicron dimensions required for extremely high frequencies. Use of molecular beam epitaxy (MBE) to form the active layer and the stop-etch buffer layer in a single continuous sequence results in layers of uniformly high quality, with clean interfaces between layers. Other advantages of the invention will become apparent from the following more detailed description, taken in conjunction with the accompanying drawings.

DESCRIPTION OF THE PREFERRED EMBODIMENT

Figure 1A:
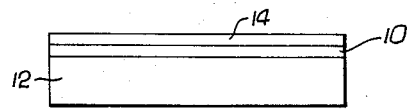
FIGS. 1a–1i are together a sequence of cross-sectional views showing the principal process steps of the invention.

As shown in the drawings for purposes of illustration, the present invention is principally concerned with field-effect transistors, and in particular with field-effect transistors (FET's) suitable for operation at extremely high frequencies. Significant limitations on the high-frequency performance of FET's are the incremental transconductance of the device and the presence of parasitic impedances. Another limitation is that operation at extremely high frequencies requires that use of submicron gate lengths, which are difficult to obtain with conventional fabrication approaches.

In accordance with the invention, an opposed gate-source transistor is fabricated by a combination of molecular beam epitaxy and electron beam lithography process steps. An active layer is formed on a first face of a substrate, and then a source area is defined as a metalized via hole on the opposite face of the substrate. A key aspect of the invention is that the position of the source area is detected from the first face of the substrate, using a back-scattered electron image.

More specifically, in the preferred embodiment of the invention, the first step is the formation of a stop-etch or buffer layer, indicated by reference numeral 10, on a semi-insulating substrate 12 of gallium arsenide (GaAS). The buffer layer 10 is of semi-insulating gallium aluminum arsenide (GaAlAs), and its purpose will become clear as the description proceeds. Next, an active layer 14 of n-type gallium arsenide is formed over the buffer layer 10. The active layer will be used as the channel region of the device. Its doping concentration will depend on the frequency and other desired characteristics of the device, but will generally be in the range $1-3 \times 10^{17}$ cm$^{-3}$, and even higher concentrations for higher frequencies. The layers 10 and 14 are preferably formed by molecular beam epitaxy in a single continuous sequence, applied to the entire surface of the substrate 12. This ensures that epitaxial layers of uniformly high quality are obtained, with clean interfaces between the layers. The substrate is polished to a thickness of approximately 4 mils (0.004 inch).

Figure 1B:
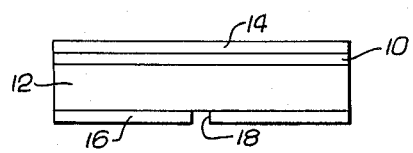
Figure 1C:
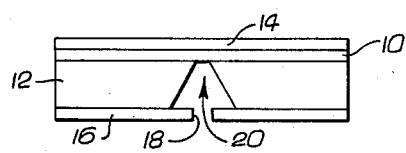
Figure 1D:
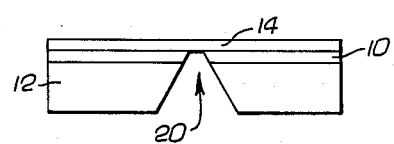
Figure 1E:
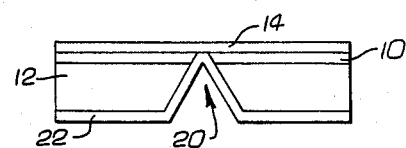

In the next step, as shown in FIG. 1b, a layer 16 of silicon nitride ($Si_3N_4$) is deposited on the underside of the substrate 12, and is selectively etched to define a via hole pattern 18 through which a via hole will be etched for each source area to be formed. In the first etching stage, as shown in FIG. 1c, a tapered via hole 20 is formed in the substrate 12, using a etchant material that will not react with the buffer layer 10. For example, ammonium hydroxide ($NH_4OH$) and hydrogen peroxide ($H_2O_2$) could be used in this first stage. Then, as shown in FIG. 1d a different etchant material, such as hydrochloric acid (HCl), is used to extend the via hole 20 through the buffer layer 10 without attacking the active layer 14. As shown in FIG. 1e, formation of the source is completed by evaporation of a metalization layer 22 to cover the via hole 20 and the entire underside of the substrate 14.

Figure 1F:
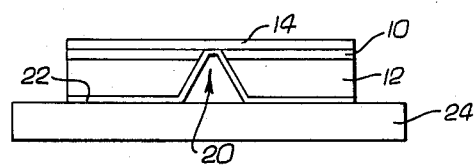

In the next step, shown in FIG. 1f, the device is bonded to another gallium arsenide substrate 24, to provide mechanical support during the subsequent processing steps. The device is loaded into an electron beam lithography (EBL) machine (not shown), and the position of the source via hole 20 is determined from a back-scattered electron image of the device. Alignment marks are then formed on the device in precise relation to the located source via hole 20. With the source location now precisely determined, the device is completed in accordance with the remaining process steps illustrated in FIGS. 1g–1i.

Figure 1G:
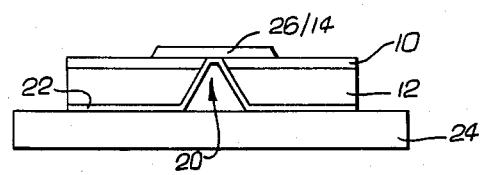
Figure 1H:
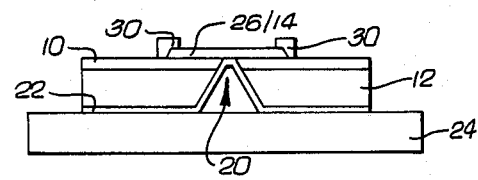
Figure 1I:
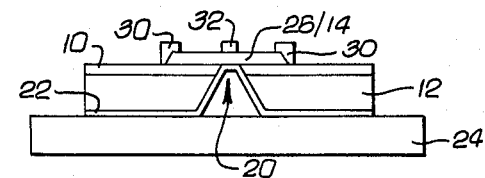

As shown in FIG. 1g, a mesa area 26, centrally located with respect to the source, is defined be a selective etching step in which the surrounding areas of the active layer 14 are removed, leaving only the mesa area 26. In the step shown in FIG. 1h, two drain areas 28 are defined at the edges of the mesa area 26, and drain ohmic metal 30 is evaporated and alloyed in a conventional manner. Finally, as shown in FIG. 1i, a gate area 32 is defined, also by electron beam lithography, in a position immediately above the center of the source via hole 20. Gate metal is evaporated onto the device and the device is completed.

It will be appreciated from the foregoing that the present invention represents a significant advance in field-effect transistors for operation at extremely high frequencies. In particular, the invention provides a novel approach to the fabrication of FETs having opposed gate and source terminals. The use of molecular beam epitaxy to form the active channel region of the device, and electron beam lithography to locate the precise position of a source via hole formed in the device, provides a device in which the active channel is of uniformly high quality and in which the source and gate areas are defined and aligned with submicron accuracy. This results in significantly improved performance at extremely high frequencies. It will also be appreciated that, although one embodiment of the invention has been described in detail for purposes of illustration, various modifications may be made without departing from the spirit and scope of the invention. Accordingly, the invention should not be limited except as by the appended claims.

We claim:

1. A method for fabricating a field-effect transistor (FET) capable of operation at extremely high frequencies, said method comprising the steps of:
   forming a semiconductor channel region on a first face of a substrate;
   forming a via hole from the opposite face of the substrate;
   metalizing the via hole to form an FET source;
   determining the location of the source from a back-scattered electron image obtained by scanning the first face of the substrate with an electron beam;
   forming drain areas on the channel region; and
   forming a gate on the channel region opposite the FET source.

2. A method as set forth in claim 1, wherein:
   said method further includes the step of forming a stop-etch buffer layer between the substrate and the channel region; and
   said step of forming a via hole includes a first etching step in which the etchant employed does not react with the material of the stop-etch buffer layer, and a second etching step in which the etchant employed extends the via hole through the buffer layer without reacting with the channel region material.

3. The method of claim 1, wherein said drain and gate are symmetrical with respect to said source.

4. A method as set forth in claim 2, wherein:
   said step of forming drain areas is preceded by a step of selectively etching the channel region to form a mesa area; and
   the drain areas are formed at the edges of the mesa area and the gate is formed at the center of the mesa area.

5. A method as set forth in claim 4, wherein said steps of forming the channel region and forming the stop-etch buffer layer are performed in accordance with a molecular beam epitaxy process in a single continuous sequence.

6. A method for fabricating a field-effect transistor (FET) capable of operation of extremely high frequencies, said method comprising the steps of:
   forming on a first face of a gallium arsenide substrate a buffer layer of gallium aluminum arsenide;
   forming on the buffer layer an active layer of n-type gallium arsenide;
   forming on the opposite face of the substrate a layer of silicon nitride;
   selectively removing an area of the silicon nitride layer to define the position of a source via hole;
   etching a via hole into the substrate at the defined location;
   extending the via hole with an etchant capable of removing material of the buffer layer;
   metalizing the inner surface of the source via hole and the surrounding surface of the substrate;
   mounting the device on another supporting substrate;
   determining from a back-scattered electron image the position of the source via hole as viewed from the first face of the substrate;
   forming a mesa area from the active layer, enclosing the source via hole;
   forming drain areas in proximity to the source via hole; and
   forming a gate on the active layer opposite the source via hole.

7. A method as set forth in claim 6, wherein:
   said steps of forming a mesa area, forming drain areas and forming a gate all employ electron beam lithographic processes to define the respective areas.

8. A method as set forth in claim 6, wherein:
   said steps of forming the buffer layer and the active layer employ molecular beam epitaxy.

9. The method of claim 6, wherein said drain and gate are symmetrical with respect to said source.

* * * * *